(12) United States Patent
Nguyen et al.

(10) Patent No.: US 7,139,174 B1
(45) Date of Patent: Nov. 21, 2006

(54) TECHNIQUES FOR ATTACHING A HEAT SINK ASSEMBLY TO A CIRCUIT BOARD COMPONENT

(75) Inventors: Toan Nguyen, San Jose, CA (US); Michael Chern, San Jose, CA (US); Saeed Seyed, Los Altos Hills, CA (US)

(73) Assignee: Cisco Technology, Inc., San Jose, CA (US)

(*) Notice: Subject to any disclaimer, the term of this patent is extended or adjusted under 35 U.S.C. 154(b) by 303 days.

(21) Appl. No.: 10/695,682

(22) Filed: Oct. 29, 2003

(51) Int. Cl.
*H05K 7/20* (2006.01)

(52) U.S. Cl. .................. 361/719; 361/709; 361/718; 257/718; 165/80.3

(58) Field of Classification Search ............ 361/704, 361/719, 717–720, 709–710; 257/706–707, 257/718–719, 727; 165/80.3
See application file for complete search history.

(56) References Cited

U.S. PATENT DOCUMENTS

| | | | |
|---|---|---|---|
| 4,587,595 A | 5/1986 | Staples ..................... | 361/710 |
| 4,607,685 A | 8/1986 | Mitchell, Jr. .............. | 165/80.3 |
| 5,198,887 A | 3/1993 | Brown ...................... | 361/717 |
| 5,295,043 A | 3/1994 | Beijer ...................... | 361/704 |
| 5,329,426 A | 7/1994 | Villani ..................... | 361/719 |
| 5,640,305 A | 6/1997 | Smithers ................... | 361/719 |
| 5,734,556 A | 3/1998 | Saneinejad et al. ......... | 361/719 |
| 5,754,401 A | 5/1998 | Saneinejad et al. ......... | 361/705 |
| 5,804,873 A | 9/1998 | Pelly ....................... | 257/675 |
| 5,875,545 A | 3/1999 | DiStefano et al. .......... | 29/840 |
| 5,894,882 A | 4/1999 | Kikuchi et al. ............ | 165/80.3 |
| 5,917,700 A | 6/1999 | Clemens et al. ............ | 361/704 |
| 6,104,612 A | 8/2000 | Holland .................... | 361/704 |
| 6,115,253 A | 9/2000 | Clemens et al. ............ | 361/704 |
| 6,191,478 B1 | 2/2001 | Chen ........................ | 257/718 |
| 6,193,205 B1 | 2/2001 | Wang ....................... | 248/510 |
| 6,198,630 B1 | 3/2001 | Cromwell .................. | 361/704 |
| 6,208,517 B1 | 3/2001 | Prince et al. .............. | 361/704 |
| 6,222,734 B1 | 4/2001 | Bookhardt et al. ......... | 361/719 |
| 6,269,863 B1 | 8/2001 | Wyler ...................... | 165/80.3 |
| 6,293,331 B1 | 9/2001 | Wang ....................... | 165/80.3 |
| 6,315,038 B1 | 11/2001 | Chiu ........................ | 165/185 |
| 6,353,537 B1 | 3/2002 | Egawa ...................... | 361/704 |
| 6,401,807 B1 | 6/2002 | Wyler et al. ............... | 165/121 |
| 6,430,052 B1 | 8/2002 | Kordes et al. ............. | 361/719 |

(Continued)

OTHER PUBLICATIONS

Email from Attorney Will Jacobi of the Office of General Counsel regaring ethics issues in using the examiner's prior invention as prior art, 1 page.*

(Continued)

*Primary Examiner*—Michael Datskovsky
*Assistant Examiner*—Robert J. Hoffberg
(74) *Attorney, Agent, or Firm*—BainwoodHuang

(57) ABSTRACT

A circuit board module has a circuit board, a component mounted to the circuit board, and a heat sink assembly. The heat sink assembly includes a base member having a first edge and a second edge. The base member is configured to operate as a thermal conduit between a first location proximate to the component and a second location distal to the component. The heat sink assembly further includes a first rail member coupled to the base member along the first edge of the base member, a second rail member coupled to the base member along the second edge of the base member, and an actuation mechanism coupled to the base member. The actuation mechanism is configured to move portions of the members toward each other when the base member resides at the first location to fasten the base member to the component.

24 Claims, 5 Drawing Sheets

U.S. PATENT DOCUMENTS

| | | | |
|---|---|---|---|
| 6,492,202 B1 | 12/2002 | Lober et al. | 438/122 |
| 6,508,300 B1 | 1/2003 | Hegde | 165/80.3 |
| 6,600,652 B1 | 7/2003 | Chandran et al. | 361/704 |
| 6,672,892 B1 | 1/2004 | Chandran et al. | 439/330 |
| 6,714,416 B1 | 3/2004 | McLeod et al. | 361/719 |
| 6,728,103 B1 | 4/2004 | Smedberg | 361/703 |
| 6,856,511 B1 | 2/2005 | Viernes et al. | 361/704 |
| 2001/0030037 A1* | 10/2001 | Hellbruck et al. | 165/80.3 |
| 2003/0048610 A1* | 3/2003 | Herring et al. | 361/704 |
| 2003/0063440 A1* | 4/2003 | Chandran et al. | 361/704 |

OTHER PUBLICATIONS

TCM Thermal Reticle 32262, Research Disclosure, Feb. 1991, No. 322, Kenneth Mason Publications Ltd., England, 1 page.

Assembled Heat Sinks Folded Assemblies, Sep. 20, 2002, http://www.aavidthermalloy.com/products/foldedfin/index.shtml, 2 pages.

* cited by examiner

TECHNIQUES FOR ATTACHING A HEAT SINK ASSEMBLY TO A CIRCUIT BOARD COMPONENT

BACKGROUND

In general, a heat sink is metallic device that conveys heat from one or more circuit board components (e.g., high speed processors, Field Programmable Gate Arrays, optical transceivers, etc.) into the surrounding air. An air stream generated by a fan assembly then carries the heat away. Such operation enables the circuit board components to operate in a lower temperature range without increasing the likelihood of operating incorrectly and/or sustaining damage.

There are a variety of approaches for a circuit board manufacturer (or supplier) to mount a heat sink to a circuit board component. One conventional approach (hereinafter referred to as the "conventional standoff approach") involves the manufacturer providing mounting holes in circuit board locations surrounding the circuit board component. Under this approach, the manufacturer then installs standoffs (i.e., threaded metallic posts, nuts, and perhaps other loose hardware) on the circuit board through the mounting holes, and places the heat sink over the top of the component, perhaps with thermal transfer material disposed between the top of the component package and the heat sink to facilitate heat transfer therebetween. Next, the manufacturer rigidly secures the heat sink to the standoffs. As a result, when the component is in operation, the heat sink, which is held rigidly in place by the standoffs, conducts heat from the component and dissipates that heat into a neighboring air stream.

Another conventional approach for mounting a heat sink to a circuit board component (hereinafter referred to as the "conventional adhesive approach") involves the manufacturer essentially affixing the heat sink directly to the component package using an adhesive (e.g., tape, glue, combinations thereof, etc.) having a high thermal transfer coefficient. In this approach, the manufacturer applies a pressure sensitive adhesive (PSA) between the circuit board component and the heat sink. The manufacturer then applies pressure to between the component and the heat sink to secure them together. For some adhesives, the manufacturer further applies heat to cure glue-like material within the adhesive and thus more-rigidly secure the heat sink to the component. Accordingly, when the component is in operation, the heat sink, which is held firmly in place by the adhesive, dissipates heat from the component into the surrounding air.

SUMMARY

Unfortunately, there are deficiencies to the above-described conventional approaches to mounting a heat sink to a circuit board component. For example, in connection with the above-described conventional standoff approach, the manufacturer must sacrifice space immediately around the circuit board component to accommodate the standoffs. In particular, the manufacturer must sacrifice a significant amount of real estate on the circuit board in order to provide mounting holes and associated keep-out regions (i.e., antipads). Additionally, the manufacturer must sacrifice areas immediately above the mounting holes as well. If the manufacturer did not need to sacrifice this space, the manufacturer could utilize this space for other purposes (e.g., signal traces leading to and from the component mounting location, neighboring components, etc.). Furthermore, when the manufacturer installs the standoffs onto the circuit board, the manufacturer risks damaging the circuit board, e.g., the loose hardware can scratch or cut surface traces if dropped onto the circuit board, debris associated with the loose hardware can fall off the loose hardware and contaminate the circuit board, etc.

As another example, in connection with the above-described conventional adhesive approach, the adhesive does not always properly secure the heat sink to the circuit board component. Rather, over time the adhesive often fails thus causing the heat sink to eventually fall off the component thus depriving the component of its cooling mechanism as well as possibly hitting a portion of the circuit board and causing further damage. With the trend towards larger and heavier heat sinks (e.g., due to the trend towards using higher power components), this deficiency in the above-described conventional adhesive approach will likely worsen in the future.

Moreover, for adhesives that require the manufacturer to apply heat during installation of the heat sink, the manufacturer runs the risk of damaging the circuit board component when applying the heat. That is, when the manufacturer heats the adhesive to cure the glue-like material therein, the manufacturer may overheat the component and thus permanently damage the component package or circuitry disposed within the package, or perhaps melt or weaken solder joints connecting the component to the circuit board. Additionally, once the adhesive is in place, it is an ugly process for the manufacturer to remove the heat sink. For example, if the heat sink requires replacement but the component is otherwise in normal working order, it is very difficult to detach the heat sink from the component without damaging the component package and clean the adhesive from component in order to properly attach a new heat sink. Often, the process of removing the heat sink and the adhesive from the component damages the component thus requiring an expensive step of replacing the component as well.

In contrast to the above-described conventional approaches to mounting a heat sink to a circuit board component, embodiments of the present invention are directed to techniques for attaching a heat sink assembly to a circuit board component using rail members which are configured to move toward each other to fasten a base member of the heat sink assembly (e.g., a heat dissipating portion) in a simple and well-controlled manner. The use of such rail members alleviates the need for standoffs and thus conserves circuit board resources (e.g., circuit board real estate around the component mounting location that would otherwise be used for mounting the standoffs as in the earlier-described conventional standoff approach). Additionally, the use of such rail members alleviates the need for an adhesive that would otherwise risk damaging the component during installation when heat is applied to cure the adhesive, or that would otherwise risk damaging the component package during removal, as in the earlier-described conventional adhesive approach.

One embodiment of the invention is directed to a circuit board module having a circuit board, a circuit board component mounted to the circuit board, and a heat sink assembly. The heat sink assembly includes a base member having a first edge and a second edge. The base member is configured to operate as a thermal conduit between a first location proximate to the circuit board component and a second location distal to the circuit board component. The heat sink assembly further includes (i) a first rail member coupled to the base member along the first edge of the base member, (ii) a second rail member coupled to the base member along the second edge of the base member, and (iii) an actuation mechanism coupled to the base member. The actuation mechanism is configured to move portions of the first and second rail members toward each other when the base member resides at the first location to fasten the base member to the circuit board component. As a result, the heat sink assembly is configured to robustly attach to the circuit board component in an easy-to-install manner without consuming circuit board real estate. Additionally, the heat sink assembly is easily removable to enable convenient access to the component (e.g., for rework, for inspection, etc.).

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for attaching a heat sink assembly to a circuit board component using rail members which are configured to move toward each other to fasten a base member of the heat sink assembly (e.g., a heat dissipating portion) to the circuit board component. The use of such rail members alleviates the need for standoffs and thus conserves circuit board resources (e.g., circuit board real estate around the component mounting location that would otherwise be used for mounting the standoffs). Furthermore, the use of such rail members alleviates the need for an adhesive that would otherwise risk damaging the component during installation when heat is applied to cure the adhesive, or that would otherwise risk damaging the component package during removal.

Figure 1:
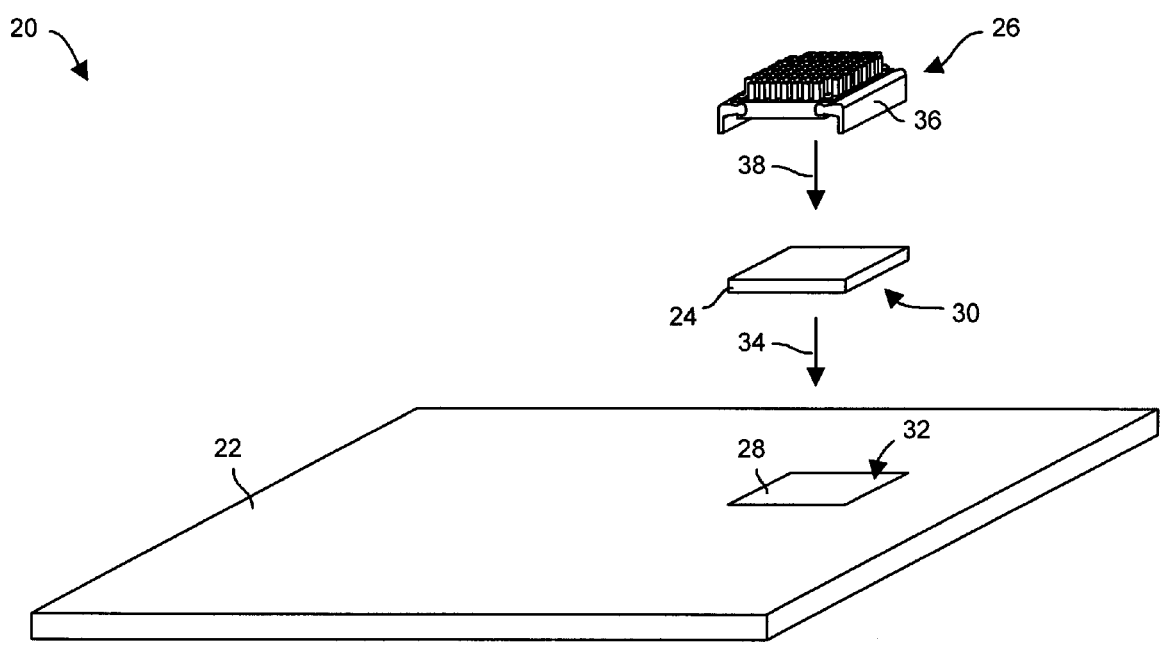
FIG. 1 shows a perspective view of various portions of a circuit board module which is suitable for use by the invention when the circuit board module is in a disassembled state.
Figure 2:
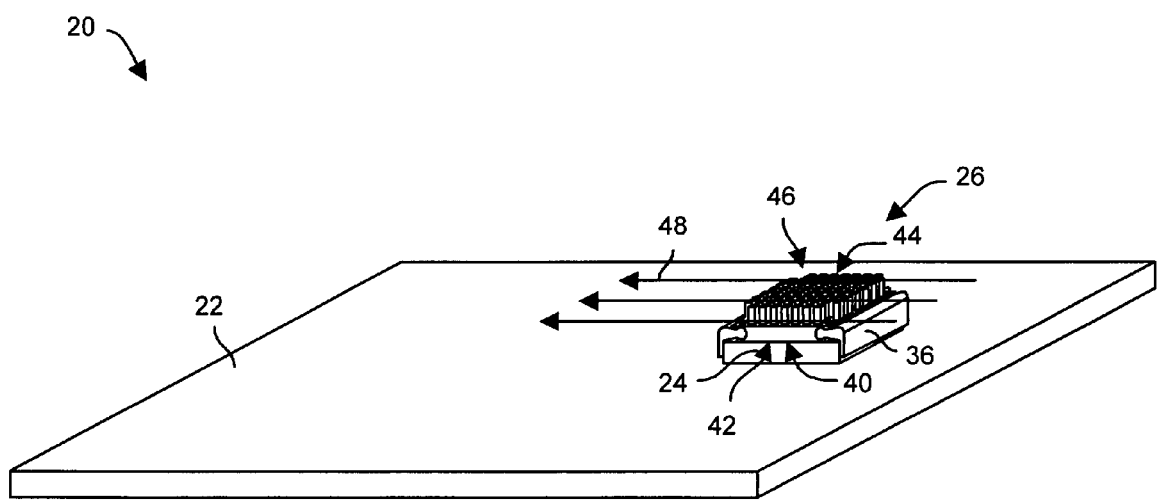
FIG. 2 shows a perspective view of the circuit board module of FIG. 1 in an assembled state.

FIGS. 1 and 2 show perspective views of a circuit board module 20 which is suitable for use by the invention. FIG. 1 shows the circuit board module 20 in a disassembled state (e.g., prior to mounting any circuit board components). FIG. 2 shows the circuit board module 20 in an assembled state. Although one of skill in the art will understand that the circuit board module 20 preferably includes multiple circuit board components, it should be understood that the circuit board module 20 is shown with a single circuit board component and an associated heat sink assembly for simplicity.

The circuit board module 20 includes a circuit board 22, a circuit board component 24 and a heat sink assembly 26.

As shown in FIG. 1, the circuit board 22 includes a component mounting location 28, and the circuit board component 24 is configured to mount to the component mounting location 28 of the circuit board 22. Any mounting technique is suitable for mounting the component 24 to the mounting location 28, e.g., solder reflow techniques, intrusive reflow techniques, pin-in-hole wave soldering, press-fit techniques, etc.

By way of example only, the circuit board component 24 has an area array package (AAP) with a high density array of surface mount technology (SMT) component contacts 30, e.g., solder balls for a Ball Grid Array (BGA) package, columns for a Ceramic Column Grid Array (CCGA) package, etc. Correspondingly, the mounting location 28 of the circuit board 22 includes a matching high density array of SMT circuit board pads 32.

A manufacturer mounts the component 24 to the circuit board 22 using a circuit board assembly process. In one arrangement, the manufacturer prints solder paste over component mounting locations on the surface of the circuit board 22 (e.g., using a stencil and squeegee), and positions circuit board components over the mounting locations and in contact with the printed solder paste (e.g., using automated pick-and-place equipment) as illustrated by the arrow 34 in FIG. 1. The manufacturer then applies heat (e.g., passes the circuit board 22 through and oven) to activate flux and melt solder within the printed solder paste thus robustly soldering the components to the circuit board 22. The manufacturer can then repeat this process on the opposite side of the circuit board 22 in order to maximize utilization of circuit board real estate. The end result is a circuit board 22 which is populated with components including the circuit board component 24.

As will be explained in further detail shortly, the heat sink assembly 26 is configured with rail members 36 to conveniently attach to the circuit board component 24 (see the arrow 38 in FIG. 1) without the need for any standoffs or for any adhesive. Rather, the rail members 36 allow the heat sink assembly 26 to secure itself directly to the component 24 (e.g., in a friction fit manner), and enables the heat sink assembly 26 to be removed relatively easily at a later time (e.g., if close inspection or reworking of the component 24 is desired).

As shown in FIG. 2, the circuit board component 24 mounts onto the circuit board 24 (e.g., via a robust set of solder joints), and the heat sink assembly 26 is firmly attached to the component 24. At this point, the heat sink assembly 26 is now disposed over the circuit board component 24, perhaps with thermal transfer material 40 disposed between the top of the component 24 and the bottom of the heat sink assembly 26 (the thermal transfer material 40 is shown generally by the arrow 40 in FIG. 2).

As a result, the heat sink assembly 26 is configured to cool the component 24 during operation. In particular, the heat sink assembly 26 is in a position to convey heat from a first location 42 proximate to the component 24 (e.g., a space immediately above the component package) to a distal location 44 further away from the component 24 (e.g., a space further above the component package) thus enabling the component 24 to operate in a lower temperature range. As will be explained in further detail shortly, the heat sink assembly 26 defines a heat dissipation portion 46 (e.g., fins, flanges, columns/rods, etc.) which extends into an air stream 48 to carry away heat which is drawn from the component 24. Further details of will now be provided with reference to FIG. 3.

Figure 3:
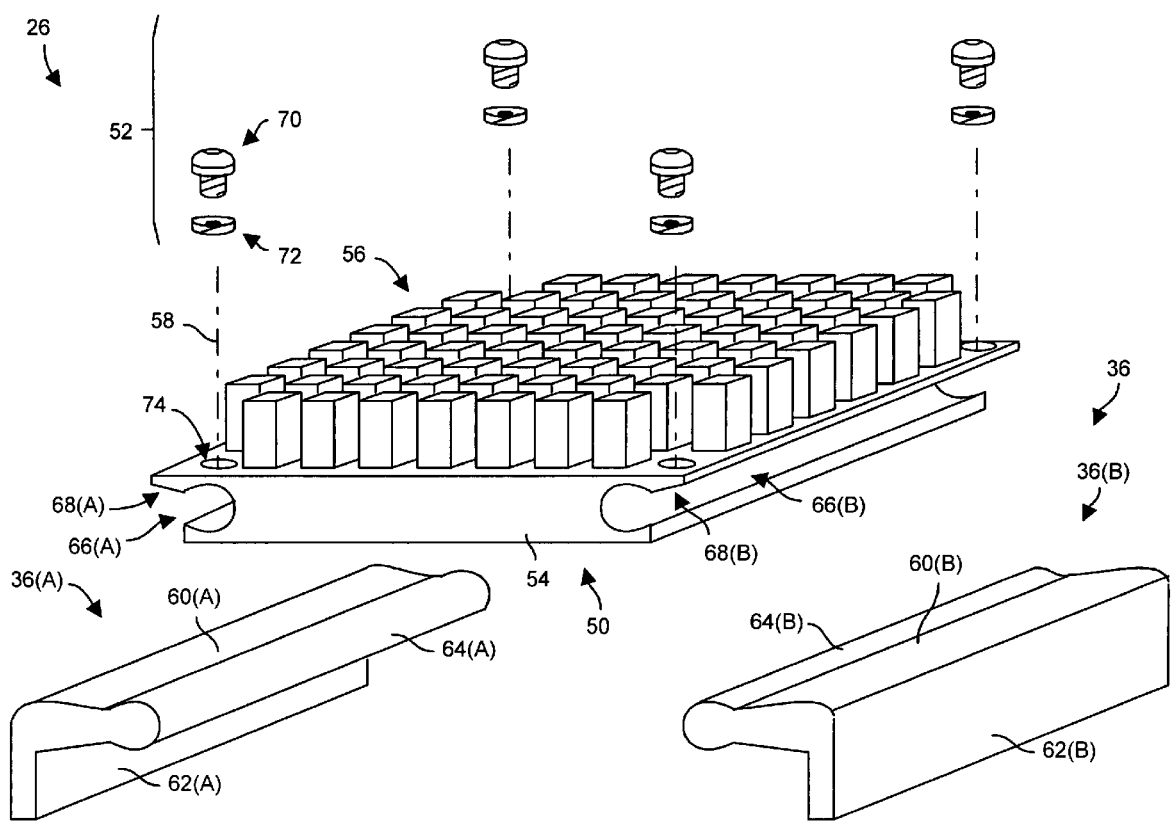
FIG. 3 is an exploded view of the heat sink assembly of FIG. 3.

FIG. 3 is an exploded view of the heat sink assembly 26. As shown, the heat sink assembly 26 includes two rail members 36(A), 36(B) (collectively, rail members 36, also see FIGS. 1 and 2), a base member 50, and an actuation mechanism 52. The base member 50 includes a bottom portion 54 which is configured to substantially mirror the shape of the circuit board component 24 (e.g., the bottom portion 54 defines a planar surface for robust thermal communication with the component 24), and a top portion 56 which is configured to dissipate heat away from the component 24 (also see the heat dissipation portion 46 in FIGS. 1 and 2).

As shown in FIG. 3, the rail members 36(A), 36(B) are generally L-shaped and include elongated lateral portions 60(A), 60(B) and vertical portions 62(A), 62(A) which are integral with the lateral portions 60(A), 60(B). The lateral portions 60(A), 60(B) define hinges 64(A), 64(B) (collectively, hinges 64) which are convex rounded lips having substantially circular cross-sections.

As further shown in FIG. 3, the base member 50 defines, on opposing edges, grooves 66(A), 66(B) (collectively, grooves 66) which are configured to respectively receive and hold the hinges 64(A), 64(B) of the rail members 36(A), 36(B). In particular, each groove 64 is a concave rounded socket having a circular cross-section that substantially mirrors that of a hinge 64. Accordingly, when the hinges 64 of the rail members 36 install into the grooves 64 of the base member 50 in a simple assembly process, the rail members 36 are capable of smoothly pivoting relative to the base member 50 in a hinge-like manner. Preferably, the base member 50 and the rail members 36 are formed of rigid material (e.g., aluminum) and dimensioned so that the base member 50 firmly clasps the rail members 36 and prevents their escape. In one arrangement, the base member 50 defines tapered ledges 68(A), 68(B) to maximize the size of the heat dissipating top portion 56 but also to provide a wide angular rotation range for the rail members 36(A), 36(B).

As further illustrated in FIG. 3, the actuation mechanism 52 includes a set of displacement members 70 (e.g., screws, bolts, etc.) and compression members 72 (e.g., compressible metallic washers, rubber bushings, springs, etc.). The base member 50 further defines a set of apertures 74 which is configured to receive and maintain the displacement members 70 (see the dashed lines 58). The apertures 74 are threaded, and correspondingly threaded portions of the displacement members 70 thread into the base member 50 through the apertures 74 to provide fine linear motion in response to rotational movement of the displacement members 70. The compression members 72 are configured to provide opposing resistive forces on the displacement members 70 to hold the displacement members 70 firmly in place relative to the base member 50 even in an environment where there is constant vibration and/or occasional jarring forces (e.g., in the presence of a vibrating fan assembly which generates the air stream 48, also see FIG. 2). This means of attaching the heat sink assembly 26 is more reliable than the earlier-described conventional adhesive approach in which the adhesive tends to fail over time. Further details of the invention will now be provided with reference to FIG. 4.

Figure 4:
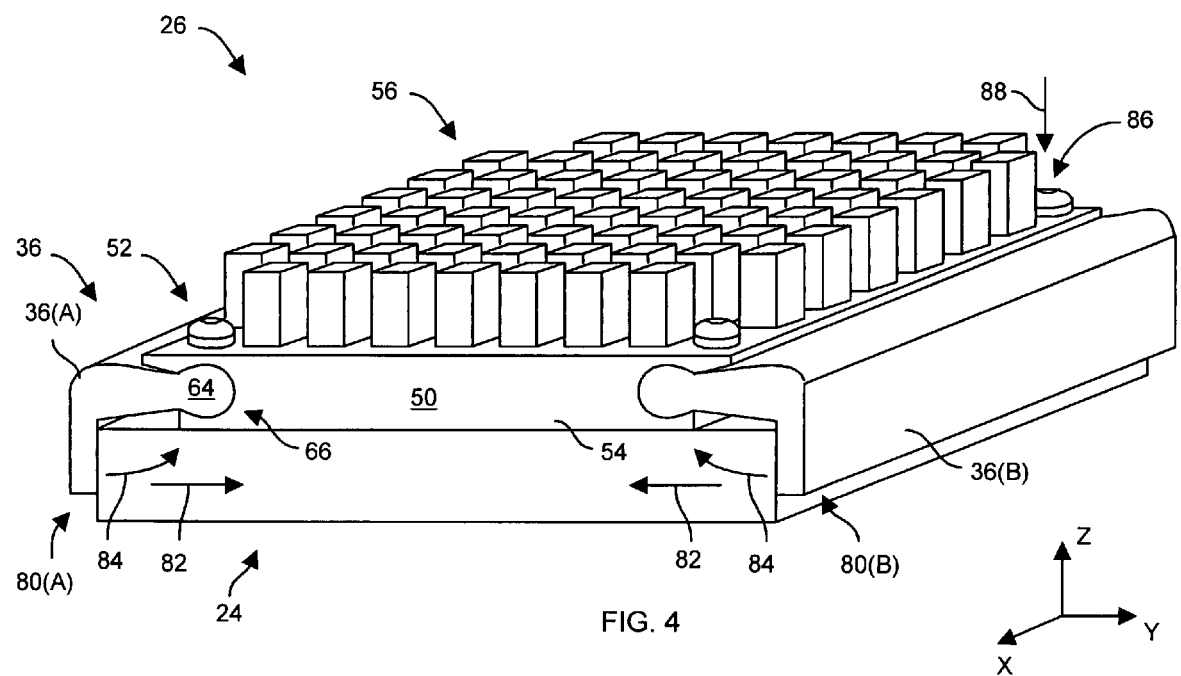
FIG. 4 shows a detailed perspective view of a heat sink assembly of the circuit board module of FIGS. 1 and 2 when the heat sink assembly is attached to a circuit board component.

FIG. 4 shows the heat sink assembly 26 in an assembled state and in an operating position over the circuit board component 24. As shown, the L-shaped configuration of the rail members 36(A), 36(B) enables distal ends 80(A), 80(B) of the rail members 36(A), 36(B) to move toward each other in response to movement of the actuation mechanism 52. In particular, rotation of the displacement members 70 (e.g., in response to a torque wrench) translates into linear motion either toward or away from the lateral portions 60(A), 60(B) of the rail members 36(A), 36(B). Because the ends of the displacement members 70(A), 70(B) push against the elongated top surfaces of the lateral portions 60(A), 60(B) of the rail members 36(A), 36(B), the linear positions of the displacement members 70(A), 70(B) relative to the base member 50 controls the angular positioning of the rail members 36(A), 36(B). In particular, when the displacement members 70 move in downward direction they apply contact force onto the top surfaces of the lateral portions 60(A), 60(B) thus squeezing the ends 80(A), 80(B) of the rail members 36(A), 36(B) together to firmly grasp the component 24.

In some arrangements, the geometries of the heat sink assembly 26 and the component 24 are such that the rail members 36(A), 36(B) primarily assert forces within the X-Y plane to hold onto the component 24 in a reliable friction fit manner (e.g., see the arrows 82). In other arrangements (e.g., arrangements in which the component 24 is relatively thin or provides an indentation along the package edge, etc.), the rail members 36(A), 36(B) are capable of providing forces to a common edge or underside of the component 24 and toward the base member 50 (e.g., see the arrows 84). In either situation, the heat sink assembly 26 robustly mounts to the component 24 without any need for standoffs or adhesive, and with minimal usage of space around the component 24.

It should be understood that operation of the displacement members 70 can be precisely controlled to ensure that the heat sink assembly 26 properly attaches to the component 24 without damaging the component 24. In one arrangement, heads or ends 86 of the displacement members 70 provide a standard interface (e.g., a hex or octagonal aperture, a Philips head, etc.) that enables a torque wrench to firmly engage and rotate the displacement members 70 and thus provide an accurate amount of linear displacement to the displacement members 70 relative to the base member 50 (see the arrow 88) to properly position the rail members 36 against the component 24 in a clamping manner.

It should be further understood that the displacement members 70, when rotated in the opposite direction, enable easy removal of the heat sink assembly 26. In particular, following displacement of the displacement members 70 in the direction opposite the arrow 88 in FIG. 4, the displacement members 70 and compression members 72 preferably remain held by the base member 50 thus preventing loose hardware from dropping onto the circuit board 22 (FIGS. 1 and 2) and perhaps damaging or contaminating the circuit board 22. Accordingly, the removal process is simple and there is no messy adhesive to overcome or remove. Rather, component inspection (or rework) can take place without risking damage to the heat sink assembly 26 and the component 24. A summary of the operation of the heat sink assembly 26 will now be provided with reference to FIG. 5.

Figure 5:
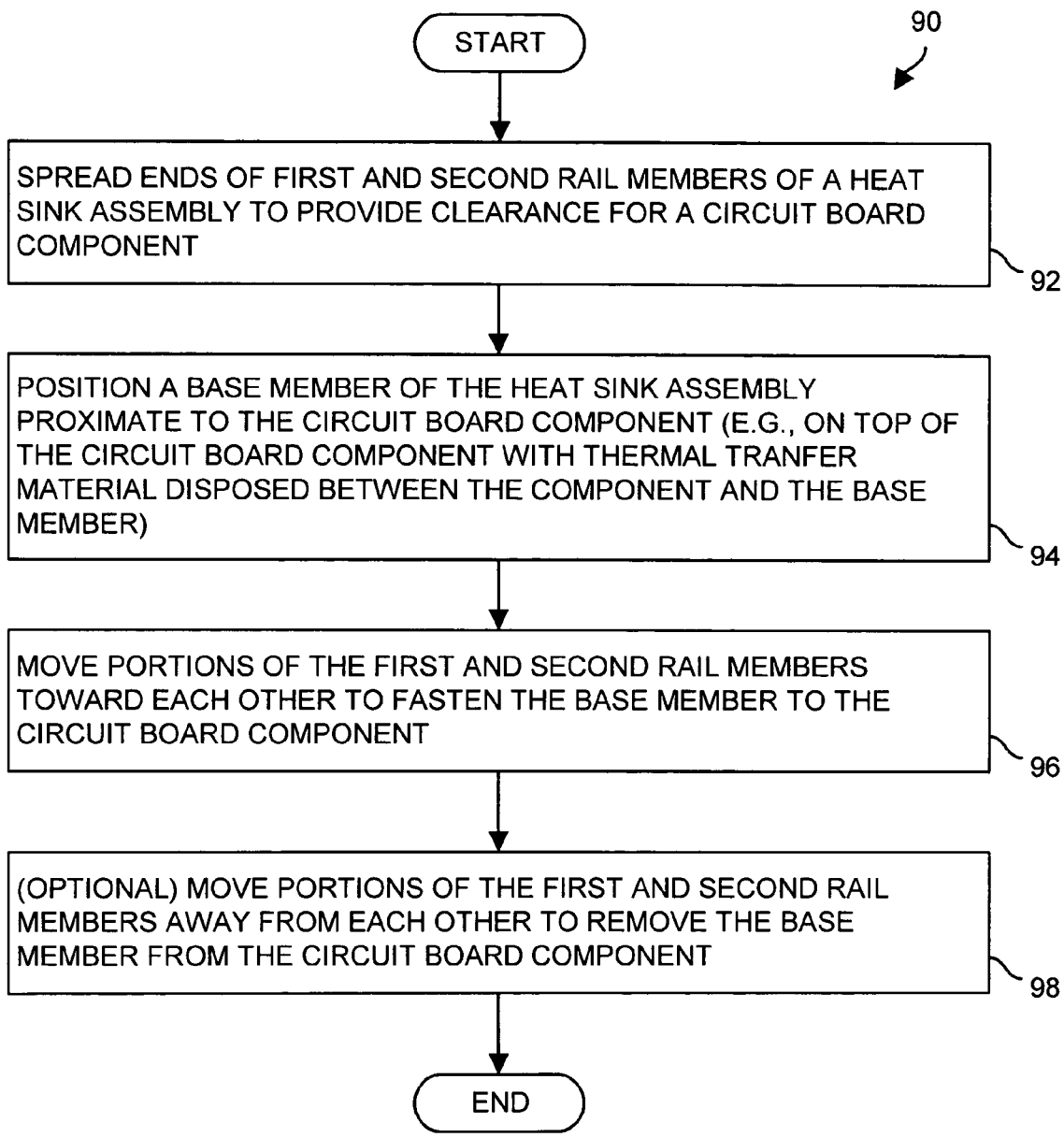
FIG. 5 is a flowchart of a procedure for using the heat sink assembly of FIG. 3.

FIG. 5 is a flowchart of a procedure 90 which is performed by a user (e.g., a technician, automated equipment, etc.) using the heat sink assembly 26. In step 92, the user spreads the ends 80(A), 80(B) of the rail members 36(A), 36(B) of the heat sink assembly 26 apart to provide clearance for the circuit board component 24 (also see FIG. 4). The user spreads the ends 80(A) 80(B) so that they extend to accommodate the full width of the component 24. The tapered ledges 68(A), 68(B) prevent the rail members 36(A), 36(B) from pivoting any further.

In step 94, the user positions the base member 50 of the heat sink assembly 26 over the circuit board component 24 (also see FIG. 4). In one arrangement, the user inserts thermal transfer material between the component 24 and the heat sink assembly 26 prior to placing the heat sink assembly 26 over the component 24 in order to improve heat transfer between the component 24 and the heat sink assembly 26.

In step 96, the user moves the end 80(A), 80(B) of the rail members 36(A), 36(B) toward each other to fasten the base member 50 to the component 24. That is, the user rotates the threaded displacement members 70 (e.g., using a torque wrench) to linearly displace the displacement members 70 relative to the base member 50 and pivotally force the rail members 36(A), 36(B) downward in a hinge-like manner. As a result, the heat sink assembly 26 achieves a secure fit over the component 24 without any standoffs that would otherwise occupy circuit board real estate, or adhesive which would risk damage to the component 24 during installation (e.g., when heat is applied) or removal (e.g., if inspection is required).

Optionally, in step 98, the user removes the heat sink assembly 26 by rotating the threaded displacement members 70 in the opposite direction. As a result, the displacement members 70 no longer apply force against the rail members 36(A), 36(B) and the ends 80(A), 80(B) of the rail members 36(A), 36(B) are free to separate. Accordingly, the user can now easily remove the heat sink assembly 26 from the component 24. There is no adhesive that must be overcome which would otherwise risk damaging the component 24. Accordingly, the user is now free to inspect the component 24 or rework the circuit board 22 if necessary (e.g., see FIGS. 1 and 2). Moreover, the user is capable of repeating the procedure 90 multiple times without harming the circuit board component 24.

As mentioned above, embodiments of the invention are directed to techniques for attaching a heat sink assembly 26 to a circuit board component 24 using rail members 36 which are configured to move toward each other to fasten a base member 50 of the heat sink assembly 26 (e.g., a heat dissipating portion 46, 56) to the circuit board component 24. The use of such rail members 36 alleviates the need for standoffs and thus conserves circuit board resources (e.g., circuit board real estate around the component mounting location that would otherwise be used for mounting the standoffs). Additionally, the use of such rail members 36 alleviates the need for an adhesive that would otherwise risk damaging the component during installation when heat is applied to cure the adhesive, or that would otherwise risk damaging the component package during removal.

The various elements of the heat sink assembly 26 (e.g., the base member 50, the rail members 36, etc.) are preferably provided using low cost simple techniques such as aluminum extrusion. Furthermore, the actuation mechanism 52 preferably includes well-cleaned hardware elements which remains fastened onto the base member 50 so that there is no loose hardware). The heat sink assembly 26 is providable in standard sizes are in customized dimensions to work with any heat sink style or geometry.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the top portion 56 of the heat sink assembly 26 was shown as vertically extending columns by way of example only (see FIG. 3). It should be understood that, in other arrangements, the top portion 56 has other configurations such as fins or flanges with increased surface area to promote heat dispersal into the surrounding environment.

Additionally, it should be understood that the base member 50 and rail members 36 of the heat sink assembly 26 were described above as being configured to provide a thermal conduit to a heat dissipating top portion 56 by way of example only. In other arrangements, the base member 50 and rail members 36 are configured to attach other things such as the end of a heat pipe in order to cool the component 24, an air deflector, a cable, a thermometer, etc.

Furthermore, it should be understood that the heat sink assembly 26 was described above as being configured to cool one component 24 by way of example only. In other arrangements, the heat sink assembly 26 contacts multiple components 24 to simultaneously cool the multiple components 24.

Additionally, it should be understood that the rail members 36 were shown above as providing a relatively smooth surface against the component 24 for a friction fit. In other arrangements, the rail members 36 define other shapes such as a tab which is configured to insert into a slot or indentation along the side of the component 24, or which is configured to grab the underside of the component 24, for a more secure fit. Such modifications and enhancements are intended to belong to particular embodiments of the invention.

What is claimed is:

1. A circuit board module, comprising:
   a circuit board;
   a circuit board component mounted to the circuit board; and
   a heat sink assembly including:
      a base member which has a first edge and a second edge, the base member being configured to operate as a thermal conduit between a first location proximate to the circuit board component and a second location distal to the circuit board component;
      a first rail member coupled to the base member along the first edge of the base member and a second rail member coupled to the base member along the second edge of the base member; and
      an actuation mechanism coupled to the base member, the actuation mechanism being configured to move portions of the first and second rail members toward each other when the base member resides at the first location to fasten the base member to the circuit board component;
   wherein the base member of the heat sink assembly is rectangular in shape; and wherein the actuation mechanism includes:
      exactly four screws, each screw being disposed in a corner portion of the base member and being configured to translate linear movement along a respective screw axis into angular displacement of a rail member.

2. The circuit board module of claim 1 wherein the base member defines a first groove along the first edge and a second groove along the second edge, wherein the first rail member defines a first hinge which engages with first groove defined by the base member along the first edge, and wherein the second rail member defines a second hinge which engages with the second groove defined by the base member along the second edge.

3. The circuit board module of claim 1 wherein the first rail member defines a first substantially elongated surface which is configured to assert a first distributed contact force onto the circuit board component in response to movement of the actuation mechanism; and wherein the second rail member defines a second substantially elongated surface which is configured to assert a second distributed contact force onto the circuit board component in response to movement of the actuation mechanism.

4. The circuit board module of claim 1 wherein each of the first and second rail members includes an actuation mechanism contacting portion and a component contacting portion which are integrally joined together to provide that rail member with an L-shaped cross-section.

5. The circuit board module of claim 1 wherein the first and second rail members are formed of rigid material and are configured to cooperatively compress, in directions which are substantially perpendicular to the respective screw axes, towards each other and against the circuit board component in response to displacement from the four screws.

6. A heat sink assembly, comprising:
a base member which has a first edge and a second edge, the base member being configured to operate as a thermal conduit between a first location proximate to a circuit board component and a second location distal to the circuit board component;
a first rail member coupled to the base member along the first edge of the base member and a second rail member coupled to the base member along the second edge of the base member; and
an actuation mechanism coupled to the base member, the actuation mechanism being configured to move portions of the first and second rail members toward each other when the base member resides at the first location to fasten the base member to the circuit board component;
wherein the base member of the heat sink assembly is rectangular in shape; and
wherein the actuation mechanism includes:
exactly four screws, each screw being disposed in a corner portion of the base member and being configured to translate linear movement along a respective screw axis into angular displacement of a rail member.

7. The heat sink assembly of claim 6 wherein the base member defines a first groove along the first edge and a second groove along the second edge, wherein the first rail member defines a first hinge which engages with first groove defined by the base member along the first edge, and wherein the second rail member defines a second hinge which engages with the second groove defined by the base member along the second edge.

8. The heat sink assembly of claim 7 wherein the base member defines, as the first groove, a first rounded socket along the first edge; wherein the base member defines, as the second groove, a second rounded socket along the second edge; wherein the first rail member defines, as the first hinge, a first rounded lip; and wherein the second rail member defines, as the second hinge, a second rounded lip.

9. The heat sink assembly of claim 8 wherein each of the first and second rounded sockets defined by the base member has a circular cross-section, and wherein each of the first and second rounded lips respectively defined by the first and second rail members has a circular cross-section that substantially mirrors that of the first and second rounded sockets defined by the base member to enable each of the first and second rail members to smoothly pivot relative to the base member in a hinge-like manner in response to movement by the actuation mechanism.

10. The heat sink assembly of claim 6 wherein the first rail member defines a first substantially elongated surface which is configured to assert a first distributed contact force onto the circuit board component in response to movement of the actuation mechanism; and wherein the second rail member defines a second substantially elongated surface which is configured to assert a second distributed contact force onto the circuit board component in response to movement of the actuation mechanism.

11. The heat sink assembly of claim 10 wherein the circuit board component extends along an X-Y plane when residing at the first location, and wherein the first and second rail members are configured to simultaneously assert the first and second distributed contact forces substantially toward each other within the X-Y plane in response to movement of the actuation mechanism.

12. The heat sink assembly of claim 10 wherein the first and second rail members are configured to assert the first and second distributed contact forces onto a common side of the circuit board component and at least partially toward the base member in response to movement of the actuation mechanism.

13. The heat sink assembly of claim 6 wherein each of the first and second rail members includes an actuation mechanism contacting portion and a component contacting portion which are integrally joined together to provide that rail member with an L-shaped cross-section.

14. The heat sink assembly of claim 13 wherein the four screws are configured to pivotally displace the actuation mechanism contacting portions of the first and second rail members to pivot the contacting portions of the first and second rail members toward each other.

15. The heat sink assembly of claim 14 wherein each screw includes (i) a threaded portion which threads into a respective threaded aperture defined by the base member and (ii) a head portion, coupled to the threaded portion, which is configured to engage an end of a torque wrench to provide that screw with rotational movement and linear displacement in response to rotation of the torque wrench.

16. The heat sink assembly of claim 5 wherein the first and second rail members are formed of rigid material and are configured to cooperatively compress, in directions which are substantially perpendicular to the respective screw axes, towards each other and against the circuit board component in response to displacement from the four screws.

17. A heat sink assembly, comprising:
a base member which has a first edge and a second edge, the base member being configured to operate as a thermal conduit between a first location proximate to a circuit board component and a second location distal to the circuit board component;
a first rail member coupled to the base member along the first edge of the base member and a second rail member coupled to the base member along the second edge of the base member; and
means for moving portions of the first and second rail members toward each other when the base member resides at the first location to fasten the base member to the circuit board component;
wherein the base member of the heat sink assembly is rectangular in shape; and
wherein the means for moving the portions of the first and second rail members toward each other actuation includes:
translation means for translating linear movement along a respective linear axis into angular displacement of a rail member.

18. The heat sink assembly of claim 17 wherein the base member defines a first groove along the first edge and a second groove along the second edge, wherein the first rail member defines a first hinge which engages with first groove defined by the base member along the first edge, and wherein the second rail member defines a second hinge which engages with the second groove defined by the base member along the second edge.

19. The heat sink assembly of claim 17 wherein the first rail member defines a first substantially elongated surface which is configured to assert a first distributed contact force onto the circuit board component in response to actuation of the means for moving; and wherein the second rail member defines a second substantially elongated surface which is configured to assert a second distributed contact force onto the circuit board component in response to actuation of the means for moving.

20. The heat sink assembly of claim 17 wherein each of the first and second rail members includes an actuation mechanism contacting portion and a component contacting portion which are integrally joined together to provide that rail member with an L-shaped cross-section.

21. The heat sink assembly of claim 17 wherein the first and second rail members are formed of rigid material and are configured to cooperatively compress, in directions which are substantially perpendicular to the respective screw axes, towards each other and against the circuit board component in response to displacement from the translation means.

22. A method for attaching a heat sink assembly to a circuit board component, the heat sink assembly including a base member, a first rail member coupled to the base member along a first edge of the base member and a second rail member coupled to the base member along a second edge of the base member, the method comprising:
    spreading ends of the first and second rail members of the heat sink assembly apart to provide clearance for the circuit board component;
    positioning a base member of the heat sink assembly proximate to the circuit board component; and
    moving the ends of the first and second rail members of the heat sink assembly toward each other to fasten the base member to the circuit board component;
    wherein moving the ends of the first and second rail members of the heat sink assembly toward each other includes rotating threaded displacement members which are configured to linearly displace relative to the base member of the heat sink assembly to pivot the first and second rail members relative to the base member in a hinge-like manner.

23. The method of claim 22 wherein the base member of the heat sink assembly is rectangular in shape; and wherein the displacement members include:
    exactly four screws, each screw being disposed in a corner portion of the base member and being configured to translate linear movement along a respective screw axis into angular displacement of a rail member.

24. The method of claim 23 wherein the first and second rail members are formed of rigid material and are configured to cooperatively compress, in directions which are substantially perpendicular to the respective screw axes, towards each other and against the circuit board component in response to displacement from the four screws.

* * * * *